(12) United States Patent
Zipper

(10) Patent No.: US 7,356,315 B2
(45) Date of Patent: Apr. 8, 2008

(54) OUTPHASING MODULATORS AND METHODS OF OUTPHASING MODULATION

(75) Inventor: Eliav Zipper, Tel Aviv (IL)

(73) Assignee: Intel Corporation, Santa Clara ( * ) Notice: Subject to any disclaimer, the term of this patent is extended or adjusted under 35 U.S.C. 154(b) by 357 days.

(21) Appl. No.: 10/736,741

(22) Filed: Dec. 17, 2003

(65) Prior Publication Data

US 2005/0136864 A1    Jun. 23, 2005

(51) Int. Cl.
*H04B 1/04* (2006.01)
(52) U.S. Cl. .................... 455/127.1; 455/114.2; 330/124 R; 330/149; 375/296; 375/300; 332/149
(58) Field of Classification Search ............. 455/110, 455/114.2, 114.3, 126, 127.3, 127.1; 375/296, 375/297, 300; 330/124 R, 10, 149; 332/149, 332/167
See application file for complete search history.

(56) References Cited

U.S. PATENT DOCUMENTS

| | | | |
|---|---|---|---|
| 2,624,041 A * | 12/1952 | Evans, Jr. .................. 332/144 |
| 3,777,275 A | 12/1973 | Cox | |
| 4,063,199 A | 12/1977 | Oursler, Jr. | |
| 4,433,312 A | 2/1984 | Kahn | |
| 4,439,744 A | 3/1984 | Kumar et al. | |
| 4,866,395 A * | 9/1989 | Hostetter .................... 329/309 |
| 5,012,200 A | 4/1991 | Meinzer | |
| 5,264,807 A | 11/1993 | Okubo et al. | |
| 5,302,914 A | 4/1994 | Arntz et al. | |
| 5,345,189 A | 9/1994 | Hornak et al. | |
| 5,365,187 A * | 11/1994 | Hornak et al. ............... 330/10 |
| 5,420,541 A | 5/1995 | Upton et al. | |
| 5,541,554 A | 7/1996 | Stengel et al. | |
| 5,548,246 A | 8/1996 | Tamamoto et al. | |
| 5,568,094 A | 10/1996 | Bowen et al. | |
| 5,621,351 A | 4/1997 | Puri et al. | |
| 5,661,434 A | 8/1997 | Brozovich et al. | |
| 5,694,093 A | 12/1997 | DaSilva et al. | |
| 5,724,005 A | 3/1998 | Chen et al. | |
| 5,739,723 A | 4/1998 | Sigmon et al. | |
| 5,758,269 A | 5/1998 | Wu | |
| 5,767,750 A | 6/1998 | Yamaji | |
| 5,786,727 A | 7/1998 | Sigmon | |
| 5,786,728 A | 7/1998 | Alinikula | |
| 5,854,571 A | 12/1998 | Pinckley et al. | |
| 5,862,460 A | 1/1999 | Rich | |
| 5,872,481 A | 2/1999 | Sevic et al. | |

(Continued)

OTHER PUBLICATIONS

U.S. Appl. No. 09/579,528, filed May 26, 2000, Jamie Hasson et al.

(Continued)

*Primary Examiner*—Edward F. Urban
*Assistant Examiner*—Blane J Jackson
(74) *Attorney, Agent, or Firm*—Pearl Cohen Zedek Latzer, LLP

(57) ABSTRACT

In one exemplary embodiment of the invention, an outphasing modulator may include at least a multiplier to multiply an amplitude modulation signal by a phase modulated carrier signal to generate a modulated signal. The outphasing modulator may also include a phase splitter to phase split the modulated signal to generate phase shifted modulated signals. The outphasing modulator may also include a sum-difference combiner to produce outphased modulated signals from the phase shifted modulated signals.

22 Claims, 3 Drawing Sheets

U.S. PATENT DOCUMENTS

| | | | |
|---|---|---|---|
| 5,880,633 | A | 3/1999 | Leizerovich et al. |
| 5,886,575 | A | 3/1999 | Long |
| 5,901,346 | A | 5/1999 | Stengel et al. |
| 5,903,854 | A | 5/1999 | Abe et al. |
| 5,909,643 | A | 6/1999 | Aihara |
| 5,929,702 | A | 7/1999 | Myers et al. |
| 5,974,041 | A | 10/1999 | Kornfeld et al. |
| 6,008,703 | A | 12/1999 | Perrott et al. |
| 6,133,788 | A | 10/2000 | Dent |
| 6,147,653 | A | 11/2000 | Wallace et al. |
| 6,181,920 | B1 | 1/2001 | Dent et al. |
| 6,201,452 | B1 | 3/2001 | Dent et al. |
| 6,271,782 | B1 | 8/2001 | Steensgaard-Madsen |
| 6,285,251 | B1 | 9/2001 | Dent et al. |
| 6,330,455 | B1 | 12/2001 | Ichihara |
| 6,587,511 | B2 | 7/2003 | Barak et al. |
| 6,633,199 | B2 | 10/2003 | Nielsen et al. |
| 6,633,200 | B2 * | 10/2003 | Kolanek .................. 330/149 |
| 6,636,112 | B1 | 10/2003 | McCune |
| 6,737,914 | B2 * | 5/2004 | Gu .............................. 330/2 |
| 6,754,287 | B2 | 6/2004 | Underbrink et al. |
| 6,825,719 | B1 | 11/2004 | Barak et al. |
| 6,983,024 | B2 * | 1/2006 | Ballantyne ............... 375/261 |
| 7,009,447 | B2 * | 3/2006 | Korol ........................ 330/10 |
| 7,030,714 | B2 * | 4/2006 | Korol ........................ 333/124 |
| 2003/0083030 | A1 * | 5/2003 | Scheffler ................ 455/245.1 |
| 2003/0125065 | A1 | 7/2003 | Hasson et al. |
| 2003/0206056 | A1 | 11/2003 | Hietala |
| 2003/0210751 | A1 | 11/2003 | Barak et al. |
| 2004/0101065 | A1 * | 5/2004 | Hagh et al. ............... 375/297 |
| 2004/0266365 | A1 | 12/2004 | Hasson et al. |
| 2004/0266368 | A1 * | 12/2004 | Rosnell ..................... 455/110 |
| 2005/0129142 | A1 | 6/2005 | Yellin et al. |
| 2006/0114060 | A1 * | 6/2006 | Hellberg et al. ......... 330/124 R |

OTHER PUBLICATIONS

U.S. Appl. No. 10/131,750, filed Apr. 24, 2002, Barak et al.

Fredrick H. Raab, "Efficiency of Outphasing RF Power-Amplifier Systems", IEEE Transactions on Communications. vol. Com-33, No. 10, Oct. 1985, pp. 1094-1099.

Steve C. Cripps, "RF Power Amplifiers for Wireless Communications", 1999, USA, pp. 219-250.

D.C. Cox, "Linear Amplification with Nonlinear Components", IEEE Transaction on Communications, Dec. 1974, pp. 1942-1945.

Bob Stengel and William R. Eisenstadt, "LINC Power Amplifier Combiner Method Efficiency Optimization", IEEE Transaction on Vehicular Technology. vol. 49, No. 1, Jan. 2000, pp. 229-234.

Bob Stengel, "LINC Linear Transmitter Technology Review", Presented at International Microwave Symposium, Boston, MA, Jun. 11, 2000, pp. 1-32.

S.A. Hetzel et al., "A LINC Transmitter", University of Bristol, IEEE, 1999, pp. 133-137.

S. O. Ampem-Darko, H.S. Al-Raweshidy, "A Novel Technique for Gain/Phase Error Cancellation in LINC Transmitters", 1999 IEEE, pp. 2034-2038.

T. A. D. Riley and M. A. Copeland, "A simplified continuous phase modulator technique," IEEE Trans. on circuits and systems, vol. 41, No. 5, pp. 321-328, May 1994.

N. M. Filiol, T. A. D. Riley, C. Plett and M. A. Copeland, "An agile ISM band frequency synthesizer with built-in GMSK data modulation," IEEE Journal of Solid-State Circuits, vol. 33, No. 7, pp. 998-1008, Jul. 1998.

M. H. Perrot, T. L. Tewksbury III, C. G. Sodini, "A 27-mW CMOS Fractional-N Synthesizer Using Digital Compensation for 2.5-Mb/s GFSK Modulation", IEEE Journal of Solid-State Circuits, vol. 32, No. 12, pp. 2048-2060, Dec. 1997.

J. Nieznanski, "Performance characterization of vector sigma-delta modulation", IECON '98, Proceedings of the 24th Annual Conference of the IEEE, vol. 1, pp. 531-536, 1998.

D.L. Neuhoff, "Polar quantization revisited", IEEE International Symposium on Information Theory, 1997 Proceedings, pp. 60, 1997.

N.O. Sokal, "RF Power Amplifiers, Classes A through S—How they operate, and when to use each", Electronics Industries Forum of New England, Professional Program Proceedings, pp. 179-183, 1997.

T. Yamaji, A. Yasuda, H. Tanimoto, Y. Suzuki, "A Digital-to-RF Converter Architecture Suitable for a Digital-to-RF Direct-Conversion Software Defined Radio Transmitter", IEICE Trans. Commun., vol. E83-B, No. 6, pp. 1254-1260, Jun. 2000.

Michael H. Perrott et al., "A Modeling Approach for $\Sigma$-$\Delta$ Fractional-$N$ Frequency Synthesizers Allowing Straightforward Noise Analysis", IEEE Journal of Solid-State Circuits, vol. 37, No. 8, Aug. 2002, pp. 1028-1038.

Zhang et al., "Multibit Oversampled Sigma—Delta A/D Convertor with Nonuniform Quantisation", Electronics Letters, Mar. 14, 1991, UK, vol. 27, No. 6, pp. 528-529.

M.H. Perrott, "Techniques for High Data modulation and Low Power Operation of Fractional-N Frequency Synthesizers", PH.D Disseration, MIT, Sep. 1997, Retrieved from the Internet, URL:http://www-mtl.mit.edu/{perrott/pages/thesis.pdf/, pp. 1-90.

Beatriz Botero, Nourredine HIFDI, "Parallelism exploitation in SAR data compression methods", EUSAR 2000, Munich, Allemagne, May 23-25, 2000.

Peric et al., "Design of Signal Constellations for Gaussian Channel by Using Iterative Polar Quantization", Electrotechnical Conference, 1998 MELECON 98., 9th Mediterranean, vol. 2, May 18-20, 1998 pp. 866-869 vol. 2 Digital Object Identifier 10.1109/MELCON.1998.699649.

Office Action of U.S. Appl. No. 09/769,444 Mailed Jun. 17, 2002, US 5,901,345.

International Search Report of Application No. PCT/IL02/00027 Mailed Aug. 2, 2002.

Office Action of Application No. 09/579,528 Mailed Oct. 19, 2001.

Office Action of U.S. Appl. No. 09/579,528 Mailed May 6, 2002.

International Search Report of Application No. PCT/IL01/00483 Mailed Nov. 15, 2001.

Office Action of U.S. Appl. No. 10/026,677 Mailed Jul. 21, 2004.

Office Action of U.S. Appl. No. 10/026,677 Mailed Mar. 23, 2005 US 6633,199, US 6133,788.

International Search Report of Application No. PCT/US2004/010959 Mailed Oct. 7, 2004.

* cited by examiner

OUTPHASING MODULATORS AND METHODS OF OUTPHASING MODULATION

BACKGROUND OF THE INVENTION

A radio transmitter may generate a radio frequency (RF) signal and may transmit it through an antenna into the surrounding. In order for a radio transmitter to be compatible with a communication standard, such as, for example, global system for mobile communication (GSM), a transmitter may have to occasionally lower the power of the transmitted signal to a low power level defined in that standard or to below that level.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

It should be understood that the present invention may be used in a variety of applications. Although the scope of the present invention is not limited in this respect, the circuits disclosed herein may be used in many apparatuses such as the transmitters of a radio system. Radio systems intended to be included within the scope of the present invention include, by way of example only, cellular radio telephone communication systems, wireless local area networks that meet the existing 802.11a, b, g, and future high data-rate versions of the above, two-way radio communication systems, two-way pagers, personal communication systems (PCS), Bluetooth wireless communication systems, Zigbee wireless communication systems and the like.

Types of cellular radiotelephone communication systems intended to be within the scope of the present invention include, although are not limited to, Direct Sequence—Code Division Multiple Access (DS-CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, wideband CDMA (WCDMA), General Packet Radio Service (GPRS) systems, Enhanced Data for GSM Evolution (EDGE) systems, 3G and 4G systems.

Figure 1:
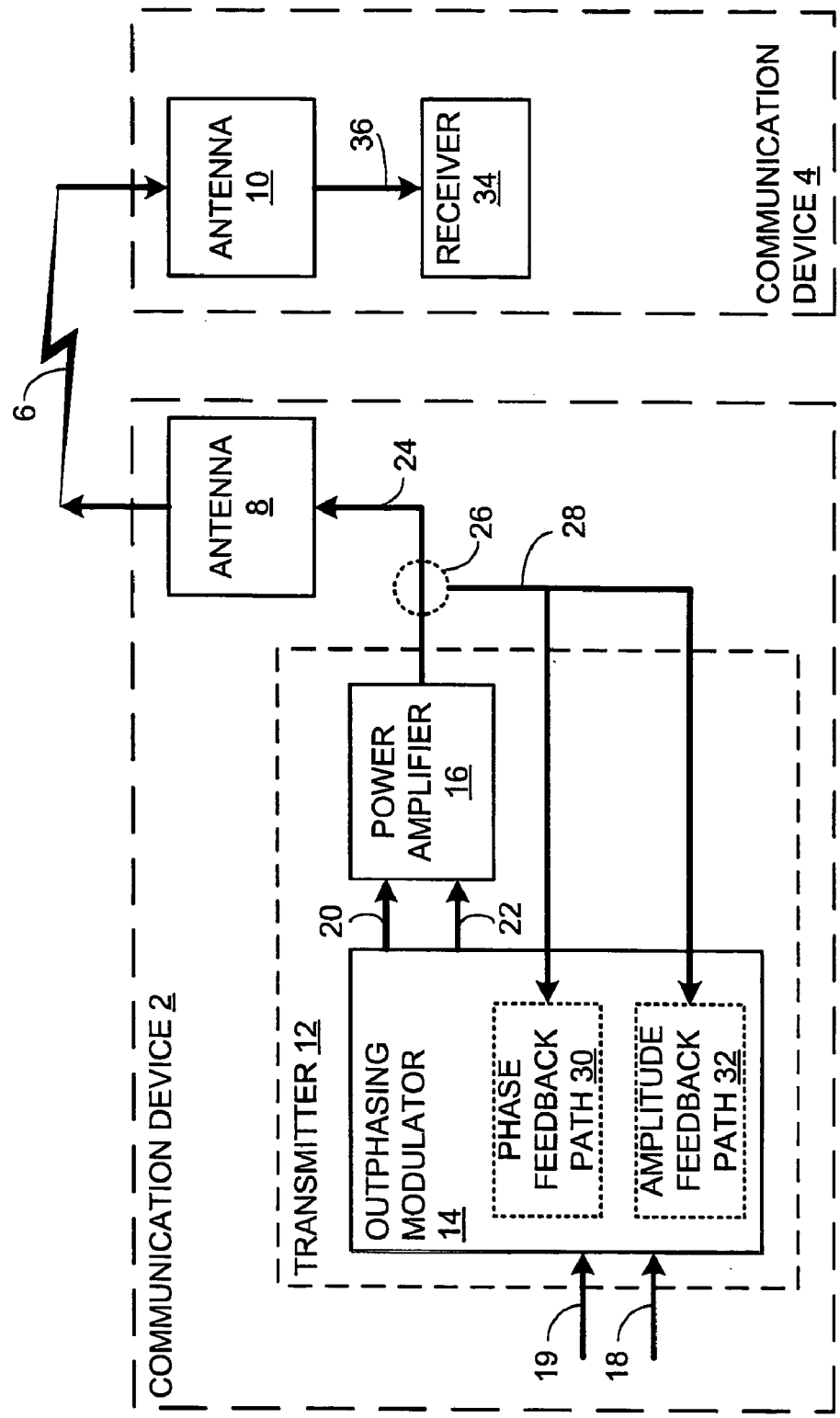
FIG. 1 is a simplified block-diagram illustration of an exemplary communication system, in accordance with some embodiments of the present invention.

FIG. 1 is a simplified block-diagram illustration of an exemplary communication system, in accordance with some embodiments of the present invention. A communication device 2 is able to communicate with a communication device 4 over a communication channel 6. A transmitter according to embodiments of the present invention may be present in communication device 2 only or in communication device 4 only or in both communication devices 2 and 4. The following description is based on the example of a transmitter according to one or another of the embodiments of the present invention present in communication device 2 only, although the scope of the present invention is not limited in this respect.

Although the scope of the present invention is not limited in this respect, the system shown in FIG. 1 may be part of a cellular communication system, with one of communication devices 2, 4 being a base station and the other a mobile station or with both communication devices 2, 4 being mobile stations, a pager communication system, a personal digital assistant and a server, etc. Communication devices 2 and 4 may include antennas 8 and 10, respectively, which may be, for example, dipole antennas, loop antennas, shot antennas dual antennas, omni-directional antennas or any other suitable antennas.

Communication device 2 may include a transmitter 12 that may include an outphasing modulator 14 and a power amplifier 16. Outphasing modulator 14 may receive a signal 18 that may contain information to be transmitted, and may modulate signal 18 using amplitude modulation, outphasing modulation, or both, and may output modulated radio frequency (RF) signals 20 and 22. Power amplifier 16 may receive modulated RF signal 20 and may amplify it, using for example, a first power amplifying element (not shown). Similarly, power amplifier 16 may receive modulated RF signal 22 and may amplify it, using for example, a second power amplifying element (not shown). Although the scope of the present invention is not limited in this respect, power amplifier 16 may combine these amplified signals by means of, for example, a transmission-line-combiner with reactive shunt terminations, and may output an RF signal 24 that may then be transmitted by antenna 8 over communication channel 6. Alternatively, the transmission-line-combiner may be replaced by a different combiner scheme, such as, for example, Hybrid BALUN or center tap inductor.

Transmitter 12 may optionally include one or more couplers 26 to sample RF signal 24 and to output one or more return signals 28 to carry samples of RF signal 24 to outphasing modulator 14. According to some embodiments of the invention, outphasing modulator 14 may optionally include a phase feedback path 30 to receive return signals 28 and to extract information about the phase of RF signal 24 from return signals 28. Additionally, outphasing modulator 14 may optionally include an amplitude feedback path 32 to receive return signals 28 and to extract information about the amplitude of RF signal 24 from return signals 28.

Outphasing modulator 14 may include both phase feedback path 30 and amplitude feedback path 32, may include only one of them, or may not include either of them. In addition, phase feedback path 30 and amplitude feedback path 32, if included in outphasing modulator 14, may be activated or de-activated individually.

Communication device 4 may include a receiver 34. Receiver 34 may receive a modulated data signal 36 from communication channel 6 via antenna 10, and may, for example, extract the information contained in signal 18 by, for example, downconverting and demodulating signal 36.

It will be appreciated by persons of ordinaty skill in the art that communication devices 2 and 4, and in particular transmitter 12 and receiver 34, may include additional components that are not shown in FIG. 1 so as not to obscure the description ofembodinjents of the invention.

Transmitter 12 may receive an average output power command 19 to set the average power of RF signal 24 accordingly. Although the scope of the present invention is not limited in this respect, transmitter 12 may receive average output power command 19 at, for example, substantially half-second time intervals, and average output power command 19 may command one of, for example, fifteen different average output power levels.

Various physical phenomena such as, for example, leakages of power from one circuit to another, or direct current (DC) offsets mismatches, may hamper the ability to decrease the power of the signal transmitted by antenna 8 to under a defined level or alternatively to turn off completely the power of the signal transmitted by antenna 8.

Outphasing modulator 14 may include attenuators to improve the ability to decrease the power of the signal transmitted by antenna 8 over communication channel 6.

Figure 2:
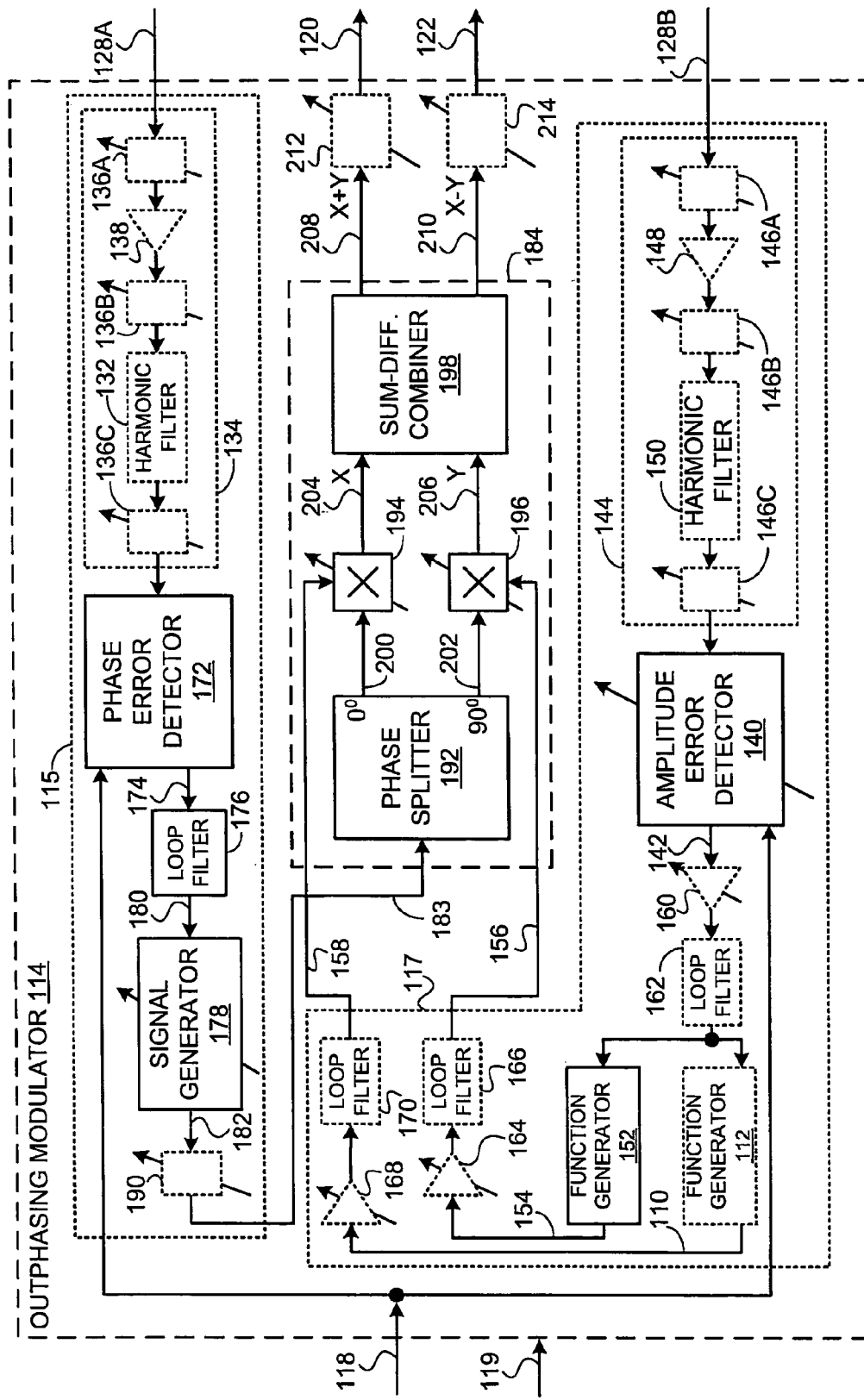
FIG. 2 is a simplified block-diagram illustration of an outphasing modulator, in accordance with some embodiments of the present invention.
Figure 3:
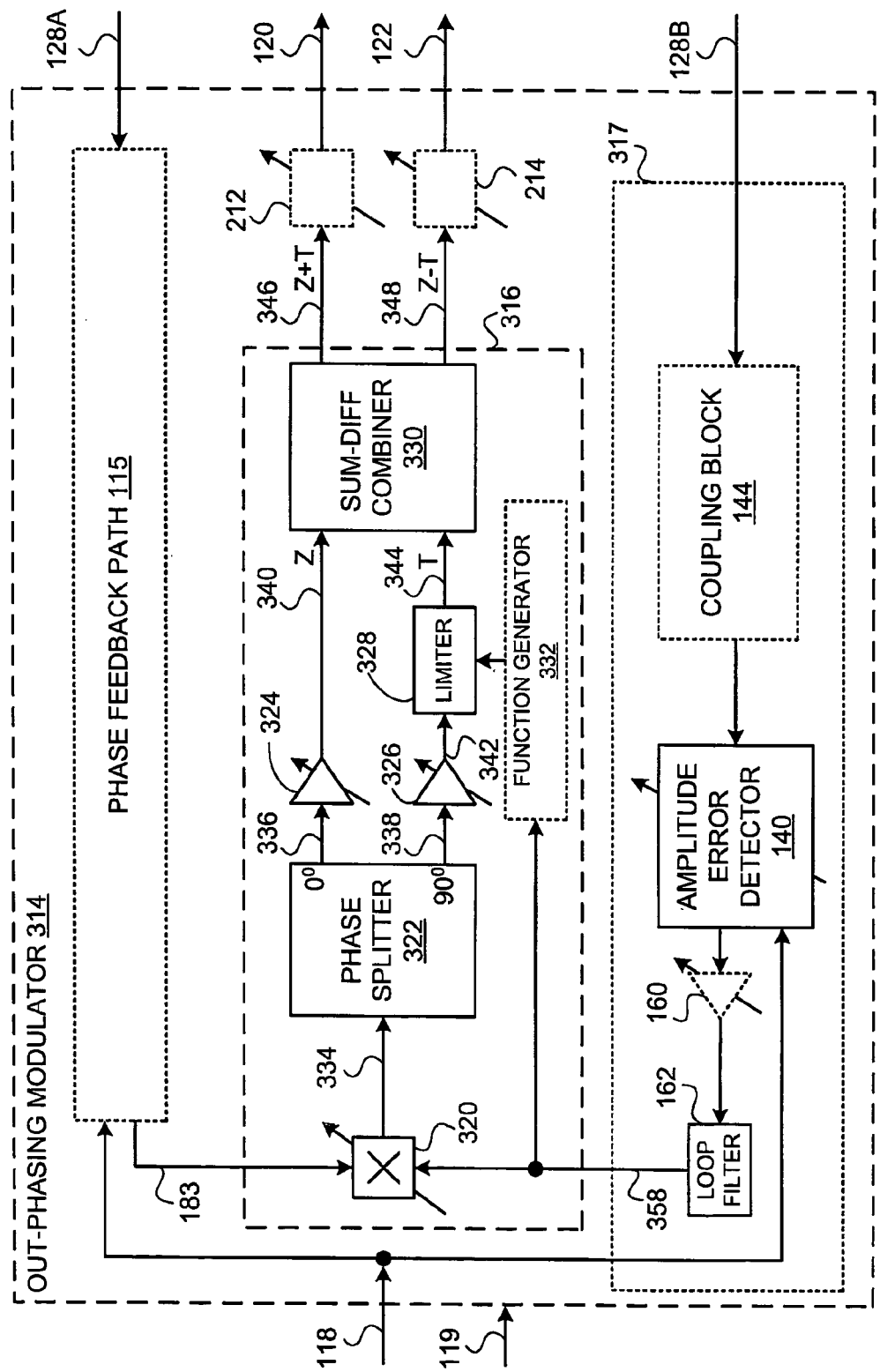
FIG. 3 is a simplified block-diagram illustration of another outphasing modulator, in accordance with some embodiments of the present invention.

Exemplary placement of such attenuators is detailed in FIGS. 2 and 3 for two alternative types of implementations of an outphasing modulator.

FIG. 2 is a simplified block-diagram illustration of an exemplary outphasing modulator, in accordance with some embodiments of the present invention.

Outphasing modulator 114 may receive a signal 118 that may contain information to be transmitted, and may output modulated RF signals 120 and 122 to a power amplifier (not shown). Outphasing modulator 114 may additionally receive return signals 128A and 128B that may carry samples of an RF signal at the output of that power amplifier. Moreover, outphasing modulator 114 may optionally receive an average output power command 119 to set the average power of the RF signal at the output of the power amplifier.

Outphasing modulator 114 may optionally include a phase feedback path 115 and may optionally include an amplitude feedback path 117. Outphasing modulator 114 may include both phase feed back path 115 and amplitude feedback path 117, may include only one of them, or may not include either of them. In addition, phase feedback path 115 and amplitude feedback path 117, if included in outphasing modulator 114, may be activated or de-activated individually.

Amplitude feedback path 117 may include an amplitude error detector 140 to receive signal 118 and return signal 128B, and to output an amplitude error signal 142 in relation to amplitude of signal 118 and amplitude of return signal 128B. Although the scope of the present invention is not limited in this respect, amplitude error detector 140 may have a controllable gain, and the amplitude of amplitude error signal 142 may be in relation to the gain of amplitude error detector 140.

Amplitude feedback path 117 may include an optional coupling block 144. Amplitude error detector 140 may receive return signal 128B directly or through optional coupling block 144. Optional coupling block 144 may include an optional programmable amplifier/attenuator 146. Although the scope of the present invention is not limited in this respect, optional coupling block 144 may include additional RF elements, and optional programmable amplifier/attenuator 146 may be located anywhere among these RF elements. For example, optional coupling block 144 may include an amplifier 148 and a harmonic filter 150. Optional programmable amplifier/attenuator 146 may be located before amplifier 148 (146A), between amplifier 148 and harmonic filter 150 (146B) or after harmonic filter 150 (146C).

Amplitude feedback path 117 may further include a function generator 152. Function generator 152 may receive signal 142 and may output a signal 154 in relation to signal 142. Amplitude feedback path 117 may output an amplitude signal 156 related to signal 154.

Amplitude feedback path 117 may optionally include a function generator 112. Function generator 112 may receive signal 142 and may output a function signal 110 in relation to signal 142. Amplitude feedback path 117 may output an amplitude signal 158 related to function signal 110.

Although the scope of the present invention is not limited in this respect, in some alternative embodiments of the invention, function generator 152 and optional function generator 112 may receive signal 142 directly. In some other alternate embodiments of the invention, function generator 152 and optional function generator 112 may receive signal 142 through elements such as, for example, a variable gain amplifier 160 and/or a loop filter 162. Variable gain amplifier 160 and loop filter 162 may be connected in any order.

In addition, and although the scope of the present invention is not limited in this respect, in some alternative embodiments of the invention, amplitude signal 156 may receive signal 154 directly. In some other alternate embodiments of the invention, amplitude signal 156 may receive signal 154 through elements such as, for example, a variable gain amplifier 164 and/or a loop filter 166. Variable gain amplifier 164 and loop filter 166 may be connected in any order.

Furthermore, and although the scope of the present invention is not limited in this respect, in some alternative embodiments of the invention, amplitude signal 158 may receive function signal 110 directly. In some other alternate embodiments of the invention, amplitude signal 158 may receive function signal 110 through elements such as, for example, a variable gain amplifier 168 and/or a loop filter 170. Variable gain amplifier 168 and loop filter 170 may be connected in any order.

If amplitude feedback path 117 includes loop filter 162, then loop filters 166 and 170 may be optional. If amplitude feedback 117 includes loop filters 166 and 170, then loop filter 162 may be optional.

Phase feedback path 115 may include a phase error detector 172 to receive signal 118 and return signal 128A and to output a phase error signal 174 in relation to the phase of signal 118 and the phase of return signal 128A.

Phase feedback path 115 may include an optional coupling block 134. Phase error detector 172 may receive return signal 128B directly or through optional coupling block 134. Optional coupling block 134 may include an optional programmable amplifier/attenuator 136. Although the scope of the present invention is not limited in this respect, optional coupling block 134 may include additional RF elements, and optional programmable amplifier/attenuator 136 may be located anywhere among these RF elements. For example, optional coupling block 134 may include an amplifier 138 and a harmonic filter 132. Optional programmable amplifier/attenuator 136 may be located before amplifier 138 (136A), between amplifier 138 and harmonic filter 132 (136B) or after harmonic filter 132 (136C).

Phase feedback path 115 may further include a loop filter 176 and a signal generator 178. Loop filter 176 may receive phase error signal 174 and may output a filtered phase error signal 180. Signal generator 178 may receive filtered phase error signal 180 and may output a constant envelope signal 182 in relation to filtered phase error signal 180. According to some embodiments of the invention, signal generator 178 may additionally receive one or more control signals to set the amplitude of constant envelope signal 182. Although the scope of the present invention is not limited in this respect, constant envelope signal 182 may be an RF signal having a constant amplitude and variable phase.

Phase feedback path 115 may output a phase modulated carrier signal 183 related to constant envelope signal 182. Phase modulated carrier signal 183 may be equal to constant envelope signal 182 or may be derived from constant envelope signal 182 through an optional programmable amplifier/attenuator 190.

Outphasing modulator 114 may include an outphasing signal generator 184 to receive amplitude signals 156, 158 and phase modulated carrier signal 183 as inputs, and to output outphased modulated signals 208 and 210.

Outphasing signal generator 184 may include a phase splitter 192, a multiplier 194, a multiplier 196 and a sum-difference combiner 198.

Phase splitter 192 may receive phase modulated carrier signal 183 and may output phase shifted signals 200 and 202 having amplitudes substantially similar to the amplitude of phase modulated carrier signal 183. Phase shifted signal 202 may have a phase delay of substantially 90° relative to phase shifted signal 200.

Multiplier 194 may receive amplitude signal 158 and phase shifted signal 200, and may output a phase shifted modulated signal 204 related to a multiplication of amplitude signal 158 by phase shifted signal 200 with a first scaling factor. Similarly, multiplier 196 may receive amplitude signal 156 and phase shifted signal 202, and may output a phase shifted modulated signal 206 related to a multiplication of amplitude signal 156 by phase shifted signal 202 with a second scaling factor. For clarity, phase shifted modulated signals 204 and 206 are denoted "X" and "Y", respectively. The first scaling factor and the second scaling factor may be substantially equivalent or may be different. The scaling factors of multipliers 194 and 196 may be controlled, for example, by controlling a direct current (DC) supplied to multipliers 194 and 196, respectively.

Sum-difference combiner 198 may receive signals X and Y, and may output sum outphased modulated signal 208, denoted "(X+Y)", and difference outphased modulated signal 210, denoted "(X−Y)".

Modulated RF signals 120 and 122 may be equal to signals (X+Y) and (X−Y), respectively, or modulated RF signals 120 and 122 may be derived from signals (X+Y) and (X−Y) through optional programmable attenuators 212 and 214, respectively.

A non-exhaustive list of exemplary mechanisms that may interfere in achieving a desired low power level at the output of the power amplifier includes:

{a.} Multipliers 194 and 196 may have inherent DC offsets in their inputs that may not be equal. Consequently, when the values of amplitude signals 156 and 158 are such that phase shifted modulated signals 206 and 204, respectively, ought to be zeroed, at least one of phase shifted modulated signals 206 and 204 may not be zeroed. In addition, it may not be possible for both amplitude signals 156 and 158 to be zeroed at the same time, further interfering in zeroing phase shifted modulated signals 206 and 204.

{b.} Parasitic leakage mechanisms may result in phase modulated carrier signal 183 being induced into outphased modulated signals 208 and 210.

{c.} Parasitic leakage mechanisms may result in phase modulated carrier signal 183 being induced into the output of the power amplifier.

{d.} Parasitic leakage mechanisms may result in phase modulated carrier signal 183 being induced into the input to amplitude error detector 140.

{e.} Amplitude error detector 140 may have a limited dynamic range and may not handle correctly low power levels at the output of the power amplifier.

{f.} Phase error detector 172 may have a limited dynamic range and may not handle correctly low power levels at the output of the power amplifier.

According to some embodiments of the invention, the power levels of modulated RF signals 120 and 122 may be controlled by the attenuation of optional programmable attenuators 212 and 214 and/or by the controllable gain/attenuation of multipliers 194 and 196, to compensate for mechanism {a.}. The attenuation of optional programmable attenuators 212 and 214 and/or the controllable gain/attenuation of multipliers 194 and 196 may be set, for example, according to average output power command 119 once per an average output power command. Attenuators 212 and 214 may have, for example, two attenuation levels: 0 db and 15 db, although this is just an example and other sets of attenuation levels are also possible. Multipliers 194 and 196 may have, for example, two gain/attenuation levels: 0 db and 15 db, although this is just an example and other sets of gain/attenuation levels are also possible.

In addition, according to some embodiments of the invention, optional programmable amplifier/attenuator 190 may reduce the power levels of phase modulated carrier signal 183 to compensate for mechanisms {b.} and {d.}.

Moreover, according to some embodiments of the invention, signal generator 178 may have a controllable output amplitude to reduce the power levels of constant envelope signal 182 to compensate for mechanisms {b.}, {c.} and {d.}.

Furthermore, according to some embodiments of the invention, optional programmable amplifier/attenuator 146 may reduce the power level of return signal 128B to fit into the dynamic range of amplitude error detector 140 and to compensate for mechanism {e.}. For example, the dynamic range of amplitude error detector 140 may be in the range of approximately 30 db-40 db, and the desired average power of the RF signal at the output of the power amplifier may have, for example, one of fifteen levels. In such an example, optional programmable amplifier/attenuator 146 may have, for example, fifteen programmable amplification/attenuation levels, although in other examples programmable amplifier/attenuator 146 may have a different set of attenuation levels. In addition, variable gain amplifiers 160, 164 and 168 may have a set of gain levels to keep a substantially constant loop gain in accordance with the attenuation of optional programmable attenuator 146.

In addition, according to some embodiments of the invention, optional programmable amplifier/attenuator 136 may reduce the power level of return signal 128A to fit into the dynamic range of phase error detector 172 and to compensate for mechanism {f.}. For example, the dynamic range of phase error detector 172 may be in the range of approximately 30 db-40 db, and the desired average power of the RF signal at the output of the power amplifier may have one of fifteen levels. In such an example, optional programmable amplifier/attenuator 136 may have fifteen programmable amplification/attenuation levels, although in other examples programmable amplifier/attenuator 136 may have a different set of attenuation levels.

FIG. 3 is a simplified block-diagram illustration of an exemplary outphasing modulator 314, in accordance with some embodiments of the present invention. FIG. 3 is similar to FIG. 2, and the same reference numerals are used to refer to the same or similar components, which are not described again.

Exemplary mechanisms {b.}, {c.}, {d.}, {e.} and {f.}, as previously described in relation to outphasing modulator 114 may similarly exist with outphasing modulator 314, and may similarly interfere in achieving a desired low power level at the output of the power amplifier. Compensations for these exemplary mechanisms may be achieved using the same techniques described for outphasing modulator 114.

However, the DC offsets mismatch that causes mechanism {a.} in outphasing modulator 114 may be avoided in outphasing modulator 314 by using one multiplier instead of two, as detailed below.

Outphasing modulator 314 may receive signal 118 and return signals 128A and 128B, may output modulated RF signals 120 and 122, and may optionally receive average output power command 119.

Outphasing modulator 314 may optionally include phase feedback path 115 and may optionally include an amplitude feedback path 317. Additionally, outphasing modulator 314 may include an outphasing signal generator 316 and optional programmable attenuators 212 and 214.

Outphasing modulator 314 may include both phase feedback path 115 and amplitude feedback path 317, may include only one of them, or may not include either of them. In addition, phase feedback path 115 and amplitude feedback path 317, if included in outphasing modulator 314, may be activated or de-activated individually.

Amplitude feedback path 317 may output amplitude signal 358. Amplitude feedback path 317 may include amplitude error detector 140, loop filter 162, and may optionally include variable gain amplifier 160 and optional coupling block 144.

Outphasing signal generator 316 may receive amplitude signal 358 and phase modulated carrier signal 183, and may output outphased modulated signals 346 and 348.

Outphasing signal generator 316 may include a multiplier 320, a phase splitter 322, an amplifier 324, an amplifier 326, a limiter 328, a sum-difference combiner 330 and an optional function generator 332.

Multiplier 320 may receive amplitude signal 358 and phase modulated carrier signal 183, and may output an amplitude modulated signal 334 related to a multiplication of amplitude signal 358 by phase modulated carrier signal 183 with a scaling factor. The scaling factor of multiplier 320 may be controlled, for example, by controlling a direct current (DC) supplied to multiplier 320.

Phase splitter 322 may receive amplitude modulated signal 334 and may output phase shifted modulated signals 336 and 338 having amplitudes substantially similar to the amplitude of amplitude modulated signal 334. Phase shifted modulated signal 338 may have a phase delay of substantially 90° relative to phase shifted modulated signal 336.

Amplifier 324 may amplify phase shifted modulated signal 336 and may output a signal 340, denoted "Z". Amplifier 326 may amplify phase shifted modulated signal 338 and may output a signal 342. Amplifiers 324 and 326 may have fixed gains or controllable gains.

Limiter 328 may receive signal 342 and may output a signal 344, denoted "T", related to signal 342 and to a limiting function. Although the scope of the present invention is not limited in this respect, the limiting function may be generated by optional function generator 332 that may be controlled by amplitude signal 358 and/or other signals (not shown).

Sum-difference combiner 330 may receive signals Z and T, and may output sum outphased modulated signal 346, denoted "(Z+T)", and difference outphased modulated signal 348, denoted "(Z−T)".

Modulated RF signals 120 and 122 may be equal to signals (Z+T) and (Z−T), respectively, or modulated RF signals 120 and 122 may be derived from signals (Z+T) and (Z−T) through optional programmable attenuators 212 and 214, respectively.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A modulation method comprising:

multiplying a first phase shifted signal by a first amplitude modulation signal with a first scaling factor to produce a first phase shifted modulated signal;

multiplying a second phase shifted signal with a second amplitude modulation signal to produce a second phase shifted modulated signal; and generating outphased modulated signals from said first phase shifted modulated signal and said second phase shifted modulated signal.

2. The method of claim 1, wherein multiplying said second phase shifted signal with said second amplitude modulation signal comprises multiplying with a second scaling factor.

3. The method of claim 2, wherein said second scaling factor is substantially equivalent to said first scaling factor.

4. The method of claim 1, further comprising:

setting said first scaling factor once per a command to set an average output power of output signals of a power amplifier, said output signals generated by amplifying said outphased modulated signals by said power amplifier.

5. The method of claim 1, wherein generating outphased modulated signals from said first phase shifted modulated signal and said second phase shifted modulated signal comprises performing a sum-difference combination of said first phase shifted modulated signal and said second phase shifted modulated signal.

6. A modulation method comprising:

multiplying a phase modulated carrier signal by an amplitude modulation signal with a scaling factor to produce an amplitude modulated signal;

phase splitting said amplitude modulated signal to generate phase shifted modulated signals;and setting said scaling factor once per a command to set an average output power of output signals of a power amplifier, said output signals generated by amplifying outphased modulated signals by said power amplifier and said outphased modulated signals generated from said phase shifted modulated signals.

7. The method of claim 6, further comprising:
limiting an amplified version of a first of said phase shifted modulated signals with a limiting function to generate a phase shifted limited signal.

8. The method of claim 7, wherein an amplification of said amplified version is controllable.

9. The method of claim 7, wherein said limiting function is controllable.

10. The method of claim 9, further comprising:
controlling said limiting function based on said amplitude modulation signal.

11. The method of claim 7, further comprising:
deriving outphased modulated signals from said phase shifted limited signal and from an amplified version of a second of said phase shifted modulated signals.

12. The method of claim 11, wherein an amplification of said amplified version of said second of said phase shifted modulated signals is controllable.

13. A transmitter comprising:
an outphasing modulator, said outphasing modulator including at least:
a multiplier to multiply an amplitude modulation signal by a phase modulated carrier signal to generate a modulated signal;
a phase splitter coupled to said multiplier, said phase splitter to phase split said modulated signal to generate phase shifted modulated signals; and
a sum-difference combiner coupled to said phase splitter, said sum-different combiner to produce from said phase shifted modulated signals outphased modulated signals.

14. The transmitter of claim 13, wherein said outphasing modulator further comprises:
a limiter coupled between said phase splitter and said sum-difference combiner, said limiter to impose a limiting function on one of said phase shifted modulated signals.

15. The transmitter of claim 14, wherein said outphasing modulator further comprises:
a function generator coupled to said limiter to generate said limiting function.

16. The transmitter of claim 13, further comprising:
programmable attenuators coupled to said sum-difference combiner to attenuate said outphased modulated signals prior to amplification of said outphased modulated signals by a power amplifier.

17. A communication device comprising:
a dipole antenna; and
a transmitter including at least
an outphasing modulator, said outphasing modulator including at least:
a multiplier to multiply an amplitude modulation signal by a phase modulated carrier signal to generate a modulated signal;
a phase splitter coupled to said multiplier, said phase splitter to phase split said modulated signal to generate phase shifted modulated signals; and
a sum-difference combiner coupled to said phase splitter, said sum-different combiner to produce from said phase shifted modulated signals outphased modulated signals; and
a power amplifier coupled to said dipole antenna and to said sum-difference combiner, said power amplifier to amplify said outphased modulated signals.

18. The communication device of claim 17, wherein said outphasing modulator further comprises:
a limiter coupled between said phase splitter and said sum-difference combiner, said limiter to impose a limiting function on one of said phase shifted modulated signals.

19. The communication device of claim 18, wherein said outphasing modulator further comprises:
a function generator coupled to said limiter to generate said limiting function.

20. A communication system comprising:
a first communication device; and
a second communication device, said second communication device including at least:
a transmitter including at least
an outphasing modulator, said outphasing modulator including at least:
a multiplier to multiply an amplitude modulation signal by a plane modulated carrier signal to generate a modulated signal;
a phase splitter coupled to said multiplier, said phase splitter to phase split said modulated signal to generate phase shifted modulated signals; and
a sum-difference combiner coupled to said phase splitter, said sum-different combiner to produce from said phase shifted modulated signals outphased modulated signals.

21. The communication system of claim 20, wherein said outphasing modulator further comprises:
a limiter coupled between said phase splitter and said sum-difference combiner, said limiter to impose a limiting function on one of said phase shifted modulated signals.

22. The communication system of claim 21, wherein said outphasing modulator further comprises:
a function generator coupled to said limiter to generate said limiting function.

* * * * *